(12) United States Patent
Inao et al.

(10) Patent No.: US 6,720,115 B2
(45) Date of Patent: Apr. 13, 2004

(54) EXPOSURE METHOD AND EXPOSURE APPARATUS USING NEAR-FIELD LIGHT AND EXPOSURE MASK

(75) Inventors: Yasuhisa Inao, Atsugi (JP); Ryo Kuroda, Kawasaki (JP); Takako Yamaguchi, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 132 days.

(21) Appl. No.: 09/795,497

(22) Filed: Mar. 1, 2001

(65) Prior Publication Data
US 2001/0036581 A1 Nov. 1, 2001

(30) Foreign Application Priority Data
Mar. 3, 2000 (JP) ........................................ 2000-058278
Feb. 26, 2001 (JP) ........................................ 2001-050898

(51) Int. Cl.[7] ............................ G03F 9/00; G03B 27/42
(52) U.S. Cl. .............................. 430/5; 430/30; 355/53; 355/73; 355/76
(58) Field of Search ........................ 430/5, 30; 355/53, 355/73, 76

(56) References Cited

U.S. PATENT DOCUMENTS 5,973,316 A   10/1999   Ebbesen et al. ............ 250/216
6,171,730 B1   1/2001   Kuroda et al. ................. 430/5
6,187,482 B1   2/2001   Kuroda et al. ................. 430/5

FOREIGN PATENT DOCUMENTS

JP   8-179493    7/1996
JP   11-72607    3/1999
JP   11-271960   10/1999

OTHER PUBLICATIONS

"Ultra–Resolution Image Transfer," IBM Technical Disclosure Bulletin, IBM Corp., New York, U.S., vol. 34, no. 10A, Mar. 1, 1992, pp. 158–162.

European Search Report dated Oct. 9, 2003, issued in corresponding European patent appln. no. 01 10 5130, forwarded in a Communication dated Oct. 22, 2003.

Primary Examiner—Christopher G. Young
(74) Attorney, Agent, or Firm—Fitzpatrick, Cella, Harper & Scinto (57) ABSTRACT

A photolithography method using near-field light includes a step of controlling the position of an exposure mask and an object to be processed so as to make the object to be located in a region where near-field light is present, and a step of exposing the object to near-field light while controlling the intensity of such light as a function of the aperture density of the exposure mask. The intensity of near-field light is controlled by modifying the aperture width or modifying the transmissivity of the exposure mask depending on the aperture density.

17 Claims, 9 Drawing Sheets

EXPOSURE METHOD AND EXPOSURE APPARATUS USING NEAR-FIELD LIGHT AND EXPOSURE MASK

BACKGROUND OF THE INVENTION

1. Field of the Invention

This invention relates to an exposure method and an exposure apparatus using near-field light and also to an exposure mask. More particularly, the present invention relates to an exposure method, an exposure apparatus and an exposure mask to be used for micro-processing operations exceeding the limit imposed from the wavelength of the light.

2. Related Background Art

Photolithography needs to be adapted to micro-processing operations involving ever-increasingly reduced dimensions in order to keep pace with the current technological advancement in the field of large capacity semiconductor memories and high-speed processing/highly integrated CPU processors.

Generally, the limit to micro-processing operations of a photolithography apparatus is defined by the wavelength of light used with the apparatus. Therefore, the wavelength of light that is used for photolithography apparatus has been reduced. Currently, near ultraviolet laser beams are used to realize micro-processing operations involving dimensions of about 0.1 $\mu$m. However, as the trend of photolithography toward more reduced dimensions goes on for micro-processing operations, there arise problems such as availability of laser beams of shorter wavelengths and lenses that can be used for micro-processing operations that deal with dimensions smaller than 0.1 $\mu$m.

Meanwhile, micro-processing apparatus realized by utilizing the configuration of a scanning near-field optical microscope (to be referred to as SNOM hereinafter) have been proposed as means using light for performing micro-processing operations involving dimensions less than 0.1 $\mu$m. For example, such an apparatus is designed to locally expose an area of a photoresist having dimensions smaller than the wavelength of light to near-field light seeping out of a micro-aperture smaller than 100 nm.

However, the micro-processing operation of a photolithography apparatus realized by utilizing the configuration of an SNOM is like that of using a single processing probe (or a few number of probes) and cannot expect a large throughput.

As an attempt to eliminate this problem, Japanese Patent Application Laid-Open No. 8-179493 discloses an arrangement using a prism relative to an optical mask and incident light is made to strike the prism with an angle that causes total reflection so as to transfer the entire pattern of the optical mask to the photoresist, using the near-field light seeping out from the total reflection plane.

On the other hand, Japanese Patent Application Laid-Open No. 11-072607 discloses an aperture pattern that can be formed on a mask. According to this patent document, when a pattern having apertures that are 150 nm to 1 $\mu$m large and arranged at a pitch of 0.6 to 1.8 $\mu$m, light is transmitted through the aperture array at a rate higher than the rate at which light is made to directly enter the apertures if a specific pitch is selected for the arrangement of apertures as a function of the wavelength of incident light that is between 0.5 and 1.0 $\mu$m. Thus, transmission of propagated light is increased.

This phenomenon is believed to boil down to the well known phenomenon of Wood's anomaly that, as the pitch of arrangement of bars of a diffraction grating comes close to the wavelength of light used for exposure, the reflected light becomes mostly the zero-order diffracted light. (Refer to M. Tsuruta, "The Pencil of Light" (1984) and "Electromagnetic Theory of Gratings" edited by R. Petet (1980).)

In view of the fact that the intensity of light transmitted through the aperture array varies periodically as a function of the wavelength of light, it can be assumed that there exists a certain periodic condition under which a resonance will occur between the pitch of the aperture array and the wavelength of the incident light. This is a phenomenon with respect to propagated light and may involve the following problems if it is applied to light exposure.

First, the dimension of processing is limited to a size within a range between half and twice the exposure wavelength since the phenomenon is caused to occur in the resonance region. Second, the exposure wavelength cannot be selected independently of the dimension of processing since the condition of resonance must be satisfied. Third, the above phenomenon is observed in the far field region with respect to propagated light, and it cannot be immediately applied to the near field region.

SUMMARY OF THE INVENTION

While the phenomenon described above relates to propagated light, the inventors of the present invention have found that the intensity of near-field light also changes as a function of the density of apertures on a mask. Therefore, the intensity of near-field light changes when masks with different aperture densities are or a mask having areas with different aperture densities is used for exposure so that it is difficult to form a uniform pattern because the pattern is apt to become uneven due to the uneven exposure to light.

In view of the above circumstances, it is, therefore, the object of the present invention to provide an exposure method, an exposure apparatus and an exposure mask that can form a uniform pattern when using near-field light.

According to the invention, the above object is achieved by providing an exposure method using near-field light, the method comprising:

a step of controlling the position of an exposure mask to control the distance between the exposure mask and an object to be processed so as to make the object to be located in a region where near-field light is present; and a step of exposing the object to be processed to light by controlling the intensity of near-field light as a function of the aperture density of the exposure mask.

According to the invention, there is also provided an exposure apparatus using near-field light, the apparatus comprising:

light irradiating means for irradiating light to be used for exposure;

gap controlling means for controlling the gap between an object to be processed and an exposure mask;

support means for supporting the exposure mask having at least a pair of apertures of a size smaller than the wavelength of light to be used for exposure arranged in a region of a size as large as the wavelength of light to be used for exposure; and control means for controlling the intensity of near-field light as a function of the aperture density of the exposure mask.

According to the invention, there is also provided an exposure mask comprising at least a pair of apertures of a size smaller than the wavelength of light to be used for exposure arranged in a region of a size as large as the wavelength of light to be used for exposure.

An exposure method, an exposure apparatus and an exposure mask according to the invention can be adapted to changes in the quantity of light due to variations in the aperture density so that it is possible to produce a micro-pattern for processing operations almost free from variations depending on the aperture density.

DESCRIPTION OF THE PREFERRED EMBODIMENTS

Now, the present invention will be described in greater detail by referring to the accompanying drawings that illustrate some best modes of carrying out the invention.

In such modes of carrying out the invention, it is possible to perform micro-processing operations almost without fluctuations due to aperture density by appropriately regulating the rate at which the object to be processed is exposed to near-field light as a function of the aperture density of the mask to be used for exposure. It is also possible to expose the object to be processed to light with a uniform near-field intensity by regulating the intensity of near-field light if the mask, or masks, used for the exposure has/have an aperture density that varies in regions of the size of the wavelength of light used for the exposure or in regions of a size between a half and twice that of the wavelength of light used for the exposure.

The present invention is based on the finding made by the inventors of the invention as a result of intensive research efforts including a series of experiments that, when apertures of a size smaller than the wavelength of light to be used for exposure are arranged in a region of a size smaller than the wavelength of light, the intensity of near-field light coming out of the apertures can be controlled by varying the aperture density. The 'aperture' mentioned here may include an aperture having a same dimension smaller than the wavelength in any direction such as a circular one, or an aperture having different dimensions in the longitudinal and lateral directions one of which (i.e., lateral dimension) is smaller than the wavelength.

Now, this phenomenon will be described in detail by referring to FIGS. 1 and 2.

Figure 1:
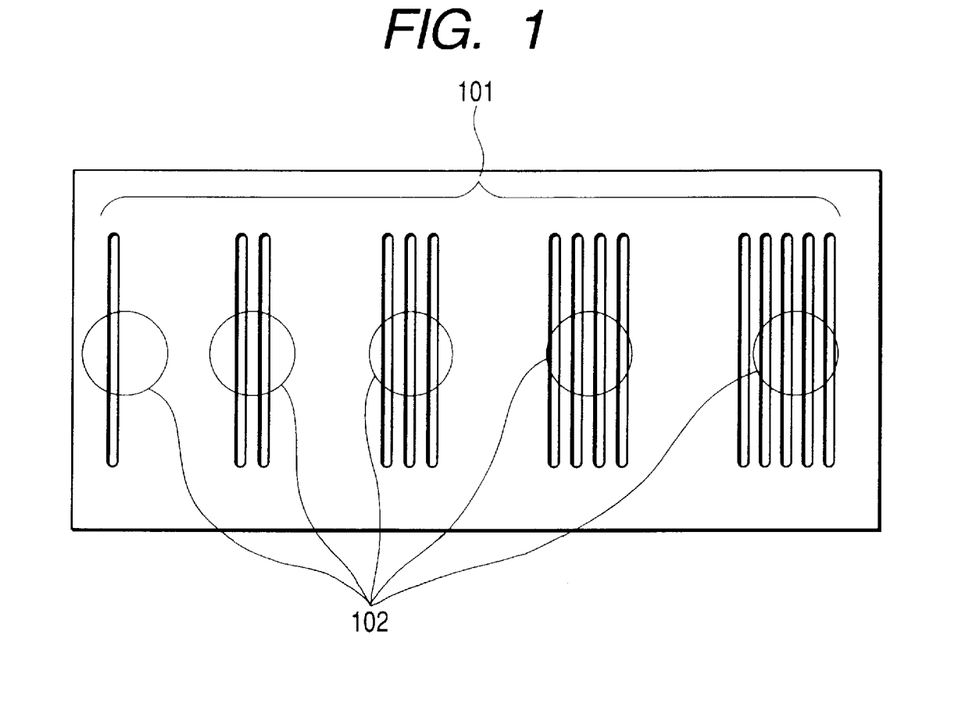
FIG. 1 is a schematic illustration of a mask having apertures that give rise to the phenomenon discovered by the inventors of the present invention.
Figure 2:
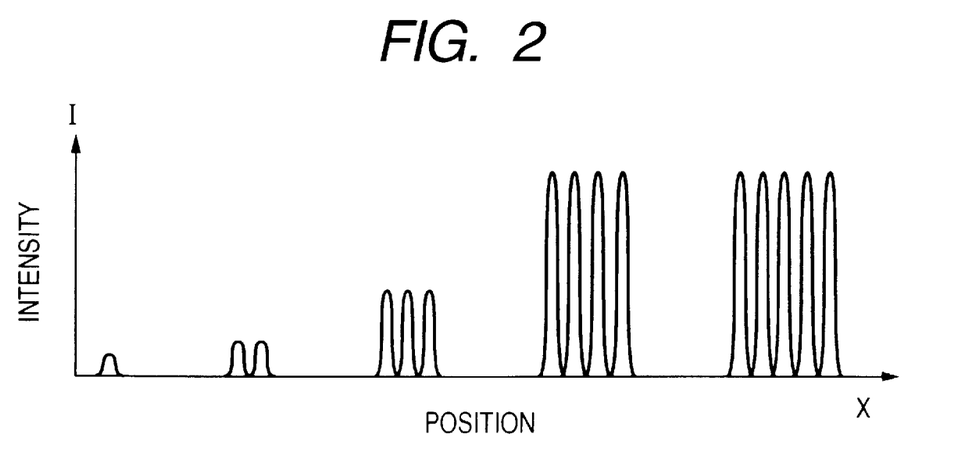
FIG. 2 is a graph showing the intensity of near-field light coming out of the apertures of FIG. 1.

Near-field light is generated when a mask having apertures 101 smaller than the wavelength of light to be used for exposure as shown in FIG. 1 is irradiated with light. The intensity of the generated near-field light varies as a function of the arrangement of the apertures 101 of a size smaller than the wavelength of light. The intensity of near-field light coming out of a region 102 having a size as large as the wavelength of light varies between when the region contains five apertures 101 having a size smaller than the wavelength of light and when the region contains only an aperture 101 of the same size. This phenomenon was confirmed through observations using a scanning near-field optical microscope (SNOM).

The intensity of near-field light is high when the region 102 having a size as large as the wavelength of light densely contains apertures 101. On the other hand, the intensity of near-field light is low when the region 102 having a size as large as the wavelength of light scarcely contains apertures 101. In FIG. 1, five regions having a size as large as the wavelength of light containing, respectively, an aperture, two apertures, three apertures, four apertures and five apertures are shown. As shown in FIG. 2, the intensity of near-field light of the region 102 of the size of the wavelength of light containing a single aperture is low and the intensity rises as a function of the number of apertures contained in the region 102. While the intensity of near-field light increases as a function of the number of apertures contained in the region 102 of the size of the wavelength of light, the increase stops when the region 102 is full of apertures and cannot contain any more apertures. Referring to FIG. 2, the intensity of near-field light of the region 102 containing four apertures and that of the region 102 containing five apertures (or four apertures and having an aperture outside the region 102 to be more accurate) are practically the same. Differently stated, the intensity of near-field light of a region having a size as large as the wavelength of light changes as a function of the density of apertures arranged therein.

As pointed out earlier, it is impossible for a single micro-aperture to expose an object to be processed to a sufficient quantity of light. However, it is now possible to perform a micro-processing operation involving dimensions smaller than the wavelength of light by using a mask for exposure adapted to near-field light on the basis of the above described phenomenon.

An embodiment of an exposure apparatus using near-field light utilizing the above phenomenon is described below by referring to FIGS. 3A, 3B, 4A, 4B and 5.

A system for exposing an object to near-field light with a mask comprises as indispensable components thereof a mask showing a desired pattern for generating near-field light, an object to be exposed to light, a distance control/drive means for brining the mask and the object to a region (<100 nm) where near-field light exists, and a stage to be used for two-dimensional alignment and a light source to be used for generating near-field light for the purpose of exposure.

Figure 5:
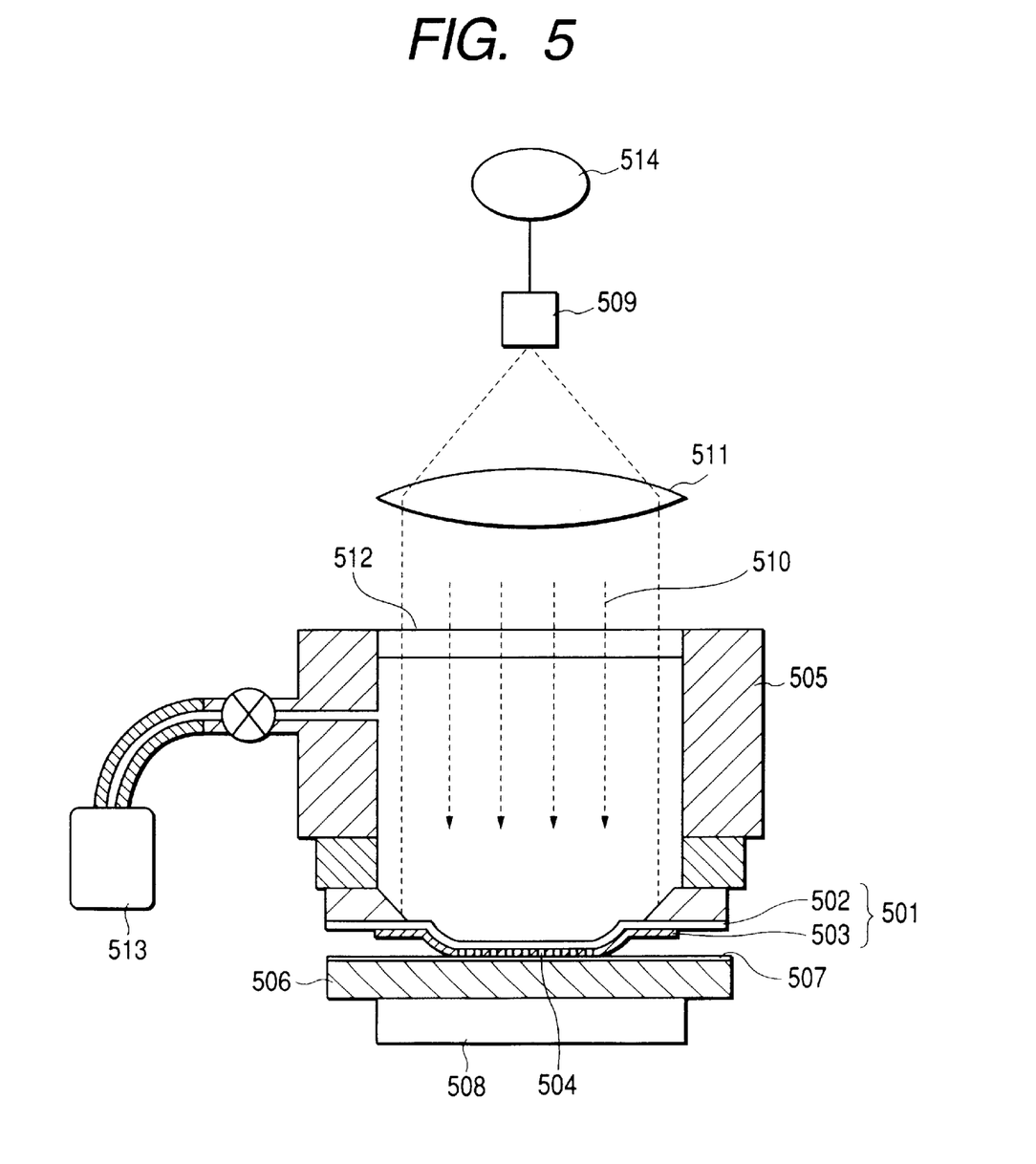
FIG. 5 is a schematic illustration of the exposure apparatus of Example 1 using near-field light and adapted to regulate the quantity of light to be used for exposure.

When generating near-field light with such a system, it is necessary to make the front surface of the mask 501 to be used for exposure to near-field light and the surface of the photoresist applied to a substrate 506 tightly adhere to each other over the entire surfaces. While they may be made to adhere to each other simply by bringing them into mutual contact when the surface of the photoresist is smooth and flat, a means for making the two surfaces tightly adhere to each other needs to be provided when the mask surface and/or the surface of the photoresist/substrate shows undulations so that tightly adhering areas and non-adhering areas can be produced if the two surfaces are simply brought to mutual contact.

Figure 3A:
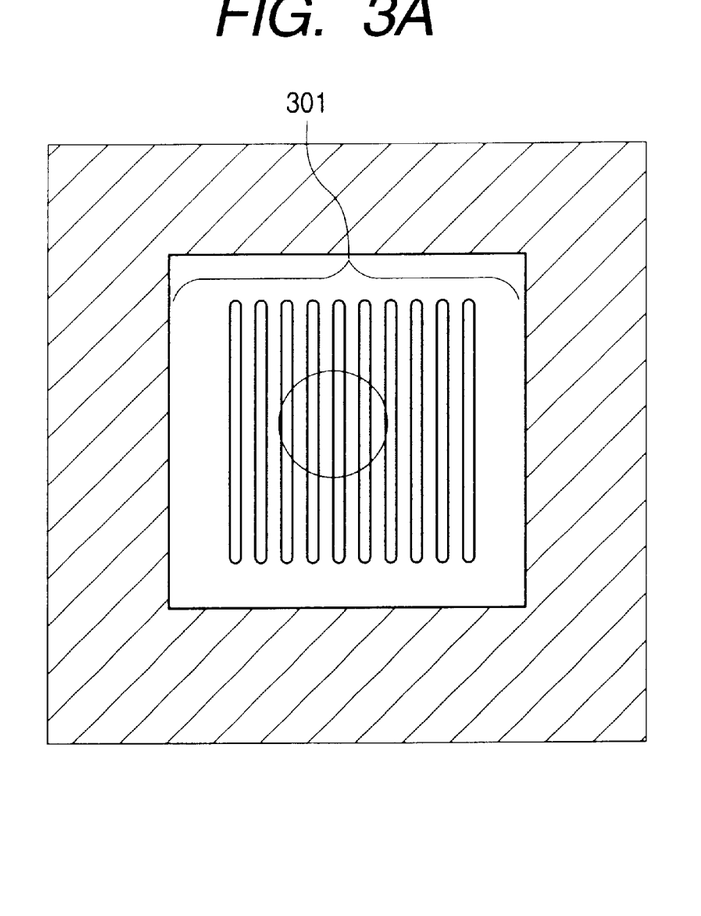
FIG. 3A is a schematic illustration of a mask showing a high aperture density.
Figure 3B:
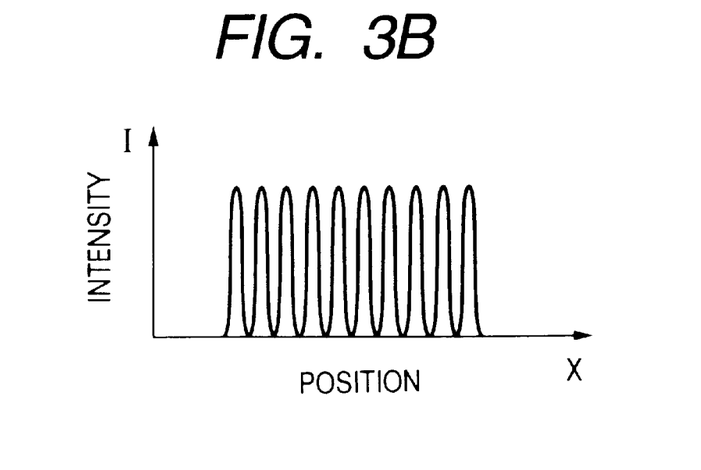
FIG. 3B is a graph showing the intensity of near-field light coming out of the apertures of FIG. 3A.
Figure 4A:
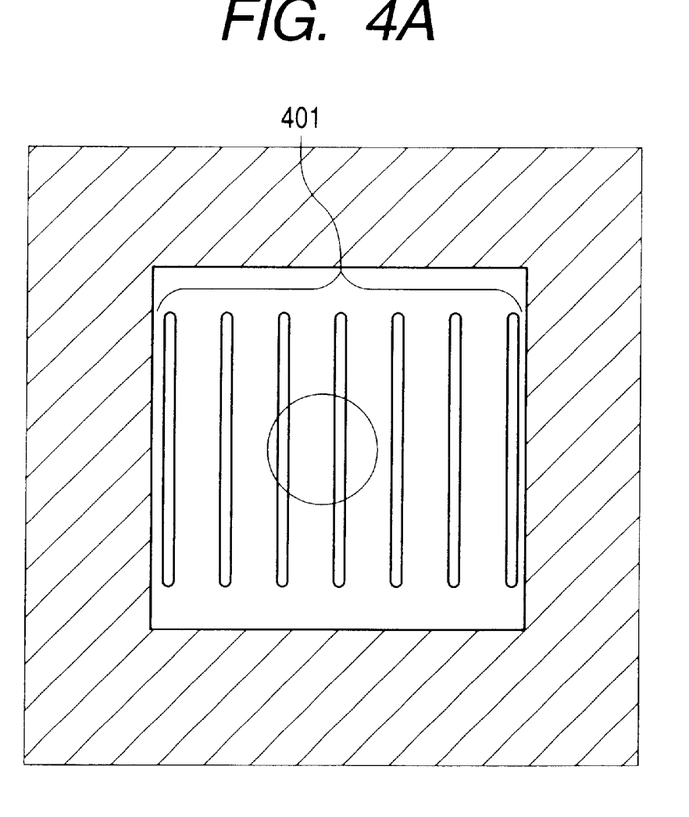
FIG. 4A is a schematic illustration of a mask showing a low aperture density and FIG. 4B is a graph showing the intensity of near-field light coming out of the apertures of FIG. 4A.
Figure 4B:
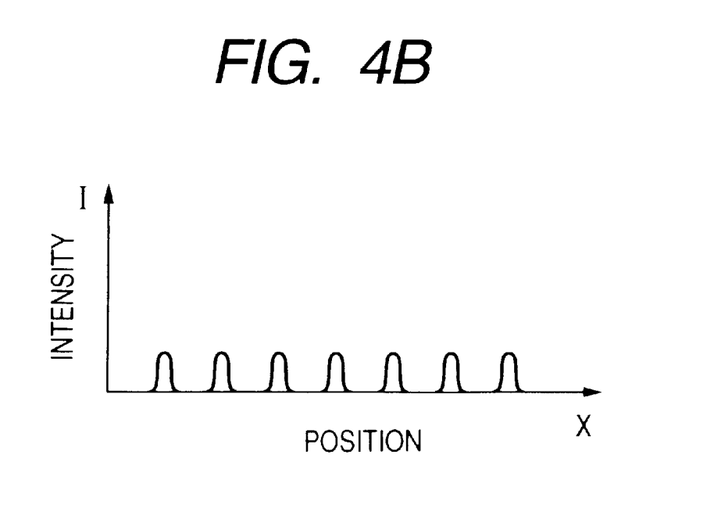

The quantity of light irradiated per unit area for exposure has to be regulated according to the density of apertures because the intensity of generated near-field light varies as a function of the density of apertures in regions having a size as large as the wavelength of light of the mask. Near-field light appears with a very strong intensity when at least a pair of apertures of a size smaller than the wavelength of light are arranged in a region of a size as large as the wavelength of light if compared with such a region containing only a single aperture. Since the intensity of near-field light coming out of a single aperture of a size smaller than the wavelength of light is very weak, it takes considerable time before getting a sufficient quantity of light for exposure. Therefore, in the case when a high exposure efficiency is required, the objective of obtaining a high exposure efficiency can be achieved by utilizing the phenomenon described above and using a mask having regions densely containing apertures of a size smaller than the wavelength of light. More specifically, when using a mask densely containing apertures of a size smaller than the wavelength of light as shown in FIGS. 3A and 3B, the quantity of light irradiated per unit area for exposure should be so regulated that no over-exposure may occur. On the other hand, when using a mask scarcely containing apertures of a size smaller than the wavelength of light as shown in FIGS. 4A and 4B, the quantity of light irradiated per unit area for exposure should be so regulated that no under-exposure may occur. Any known conventional technique may be used for the purpose of regulating the quantity of light irradiated per unit area for exposure. For example, when a semiconductor laser is used as a light source, the quantity of light irradiated per unit area for exposure can be regulated by controlling the voltage applied to the light source.

If the masks to be used for exposure show a constant density of apertures of a size smaller than the wavelength of light as shown in FIGS. 3A, 3B, 4A and 4B, the quantity of light irradiated per unit area for exposure can be regulated to a constant level for each mask. However, if a mask has regions that differ from each other in terms of the density of apertures of a size smaller than the wavelength of light, the quantity of light irradiated per unit area for exposure can vary because the intensity of near-field light varies from region to region in the same mask due to the phenomenon described above.

In a case when the mask has a pattern having high aperture density regions and low aperture density regions, a technique for regulating the quantity of light irradiated per unit area for exposure may be broadening the apertures of regions when the aperture density is low.

Another technique may be the use of a high light transmissivity material for the mask substrate in low aperture density regions so as to raise the intensity of light to be used for generating near-field light in low aperture density regions and make the mask surface to produce near-field light with a uniform intensity regardless of high aperture density regions and low aperture density regions.

With any of the above described techniques, it is possible to regulate the quantity of light irradiated per unit area for exposure depending on the pattern of micro-apertures for the operation of exposing the object to be processed to near-field light.

Now, the present invention will be described in greater detail by way of examples, although the present invention is by no means limited to the examples.

EXAMPLE 1

FIG. 5 is a schematic illustration of the exposure apparatus of Example 1 using near-field light and adapted to regulate the quantity of light to be used for exposure.

In FIG. 5, reference numeral 501 denotes a mask to be used for exposure to near-field light having an aperture pattern 504 that is to be transferred to the object to be processed. The mask 501 comprises a mask matrix 502 and a metal thin film 503. The mask 501 shows only thin film in areas where micro-apertures 504 are arranged for the reason as will be described hereinafter. The mask 501 is thick in the remaining areas so that the thin film may be supported.

The space arranged on the rear surface of the mask 501 (the space located on and above the rear surface in FIG. 5) is airtightly sealed by a pressure regulating container 505, whose internal pressure can be regulated. The object to be processed is prepared by forming a photoresist layer 507 on the surface of a substrate 506. The photoresist 507/substrate 506 is fitted onto a stage 508 and the substrate 506 is aligned two-dimensionally relative to the surface of the mask 501 for exposure to near-field light by driving the stage 508. Then, the stage 508 is driven in the direction of the normal to the mask surface until the front surface of the mask 501 for exposure to near field light and the surface of the photoresist 507 on the substrate 506 are adhered to each other over the entire surfaces with a gap less than 100 nm separating them, if any.

Thereafter, light 510 emitted from light source 509 for exposure is collimated by a collimator lens 511 and led into the pressure regulating container 505 through a glass window 512 so as to irradiate the rear surface (the upper surface in FIG. 5) of the mask 501 with light in order to expose the photoresist 507 to near-field light seeping out through the micro-aperture pattern 504 formed in the metal thin film 503 laid on the front surface of the mask matrix 502 of the mask 501.

A material to be used for a photoresist in ordinary semiconductor processes may also be used for the photoresist 507. While the range of wavelengths that can be used for exposing the material of the photoresist to light is between about 200 and about 500 nm, a wide choice of materials may be available to the photoresist 507 at a relatively low cost to provide a high degree of process freedom if they are adapted to g rays and i rays with a wavelength range between 350 and 450 nm.

The light source 509 for exposure needs to emit light having a wavelength good for the exposure of the photoresist 507. If a photoresist adapted to g rays and i rays is selected for the photoresist 507, a HeCd laser (wavelength: 325 nm, 442 nm), a GaN type blue semiconductor laser (wavelength: 410 nm), a second harmonic generation (SHG) laser or third harmonic generation (THG) laser of an infrared laser or a mercury lamp (g rays: 436 nm, i rays: 365 nm) may be used for the light source 509 for exposure.

Now, the method to be used for causing the mask 501 to be used for exposure to near-field light and the photoresist/substrate to tightly adhere to each other will be described by referring to FIG. 5. As pointed out above, while the mask 501 and the photoresist/substrate may be made to adhere to each other simply by bringing them into mutual contact when the surface of the photoresist is smooth and flat, tightly adhering areas and non-adhering areas can be produced if the two surfaces are simply brought to mutual contact when the mask surface and/or the surface of the photoresist/substrate shows undulations.

Therefore, the mask 501 for exposure to near-field light is made to be elastically deformed and bent by applying pressure to the rear surface of the mask 501 in the direction toward the front surface thereof so that the mask 501 may be tightly pressed against the photoresist 507/substrate 506 and to adhere to the entire surface of the latter.

FIG. 5 illustrates a technique for applying pressure to the rear surface of the mask 501 for exposure to near-field light. Referring to FIG. 5, the mask 501 is arranged in such a way that its rear surface faces to the inside of the pressure regulating container 505 and high pressure gas is introduced into the pressure regulating container to make the internal pressure of the pressure regulating container 505 higher than the atmospheric pressure. Alternatively, the inside of the pressure regulating container 505 may be filled with liquid that is transparent relative to light 510 emitted from the light source 509 for exposure and the pressure of the liquid in the pressure regulating container 505 may be regulated by means of a cylinder.

Still alternatively, high pressure gas may be introduced into the pressure regulating container 505 from a pressure regulating means 513 to increase the internal pressure of the pressure regulating container 505 in order to cause the front surface of the mask 501 for exposure to near-field light to tightly and uniformly adhere to the surface of the photoresist 507 over the entire surfaces thereof. With any of the above techniques for pressure application, a uniform repulsive force acts between the front surface of the mask 501 for exposure to near-field light and the surface of the photoresist 507 on the substrate 506 due to Pascal's principle. Therefore, both the front surface of the mask 501 for exposure to near-field light and the surface of the photoresist 507 on the substrate 506 are free from any local excessive force. Similarly, the mask 501, the substrate 506 and the photoresist 507 are exempted from any local destructions.

The pushing or adhesion force between the mask 501 for exposure to near-field light and the photoresist 507/substrate 506 can be controlled by regulating the internal pressure of the pressure regulating container 505. For example, if the surface of the mask and that of the photoresist/substrate show large undulations, any uneven gaps that may be produced between the surface of the mask and that of the photoresist/substrate due to the undulations can be eliminated by raising the internal pressure of the pressure regulating container 505 and hence the adhesion of the two surfaces.

While the rear surface of the mask for exposure to near-field light is made to face the inside of a pressurizing container so that pressure is applied to the front surface of the mask from the rear surface thereof due to the pressure difference between the internal pressure of the pressurizing container and the lower atmospheric pressure so as to make the mask tightly adhere to the photoresist/substrate in the above description, the front surface of the mask for exposure to near-field light and the photoresist/substrate may alternatively be arranged in a depressurizing container so that pressure is applied to the front surface of the mask from the rear surface thereof due to the pressure difference between the internal pressure of the depressurizing container and the higher atmospheric pressure. In short, it is only necessary to make the pressure on the rear surface of the mask for exposure to near-field light higher than the pressure on the front surface thereof in order to produce a pressure difference there.

After the exposure to near-field light, the mask for exposure to near-field light and the photoresist/substrate are separated from each other in a manner as described below.

The internal pressure of the pressure regulating container 505 is reduced to a level lower than the atmospheric pressure by means of the pressure regulating means 513 and the metal thin film 503 on the mask 501 for exposure to near-field light is peeled off from the surface of the photoresist 507 on the substrate 506.

When the internal pressure is reduced by this means, a uniform attractive force acts between the front surface of the mask 501 for exposure to near-field light and the surface of the photoresist 507 on the substrate 506 due to Pascal's principle. Therefore, both the front surface of the mask 501 for exposure to near-field light and the surface of the photoresist 507 on the substrate 506 are free from any local excessive force. Similarly, the mask 501, the substrate 506 and the photoresist 507 are exempted from any local destructions.

The attractive force or the pulling force between the mask 501 for exposure to near-field light and the photoresist 507/substrate 506 can be controlled by regulating the internal pressure of the pressure regulating container 505. For example, an absorptive force between the surface of the mask and that of the photoresist/substrate is large, the pulling force can be increased to facilitate the separation of the mask and the photoresist by selecting a relatively low internal pressure for the pressure regulating container.

If the front surface of the mask for exposure to near-field light and the photoresist/substrate are arranged in a depressurizing container so that pressure is applied to the front surface of the mask from the rear surface thereof due to the pressure difference between the internal pressure of the depressurizing container and the higher atmospheric pressure as described above, the internal pressure of the container has to be made higher than the atmospheric pressure when separating the mask and the photoresist.

In short, it is only necessary to make the pressure on the rear surface of the mask for exposure to near-field light lower than the pressure on the front surface thereof in order to produce a pressure difference there.

Now, the technique to be used for regulating the quantity of light emitted from the light source 509 for exposure will be described by referring to FIGS. 3A, 3B, 4A, 4B and 5.

The operation of exposing the object to be processed to near-field light that is conducted in the mode described above may require masks with various patterns in order to expose the object to different patterns of light. The aperture density varies from mask to mask and hence the use of only the light source 509 for exposure cannot produce the quantity of emitted light desired for each of the patterns. Therefore, the quantity of light emitted from the light source 509 needs to be regulated by a quantity-of-light regulating means 514.

The quantity-of-light regulating means 514 is adapted to regulate the quantity of light emitted from the light source 509 as a function of the aperture density. If, for instance, the user needs to regulate the quantity of light emitted from the light source 509 as a function of the density of the apertures formed as a pattern in the mask by means of a computer, the quantity-of-light regulating means 514 is the computer.

Figure 9:
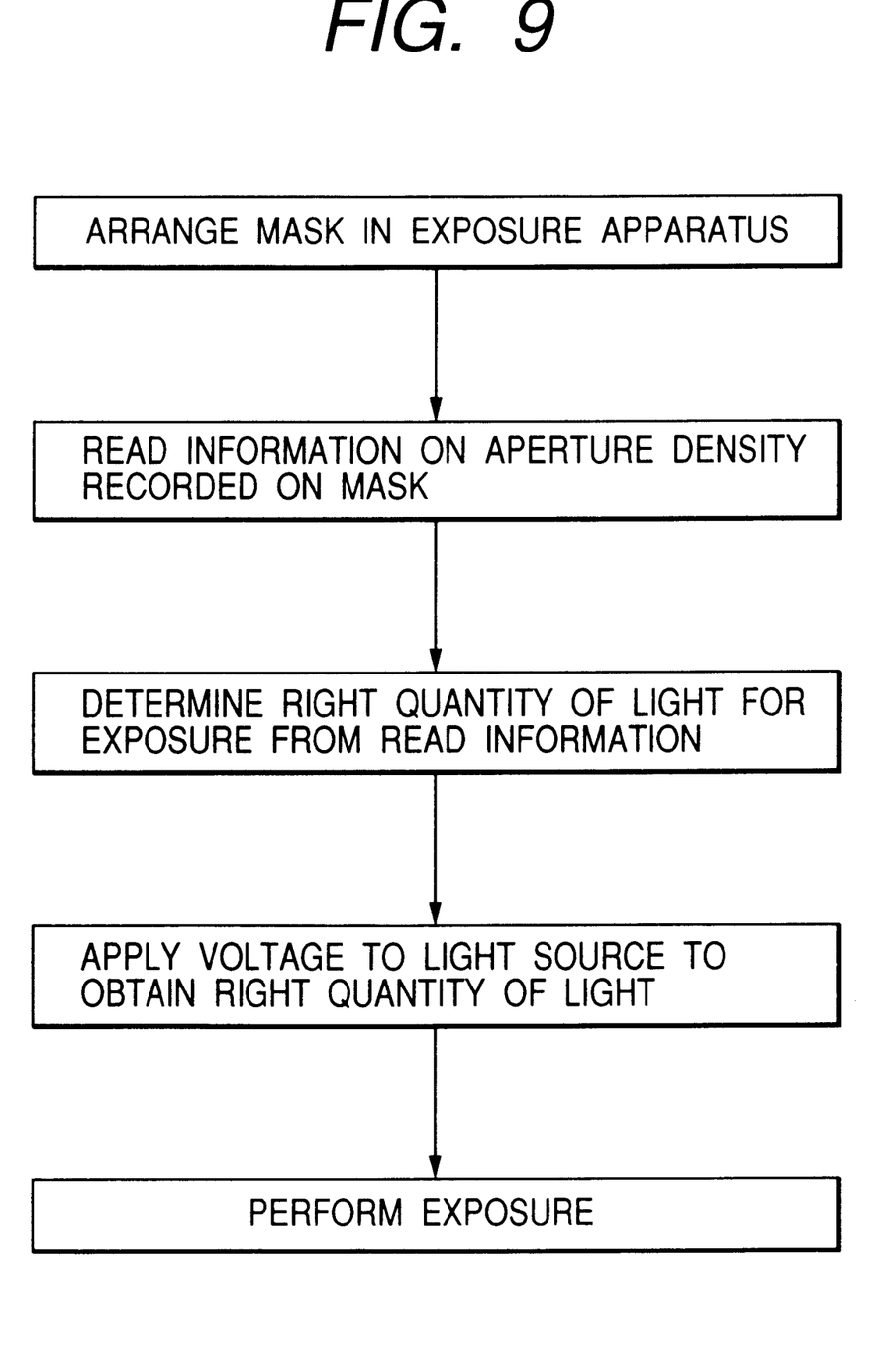
FIG. 9 is a flow chart of an exposure operation of the exposure method of Example 1.
Figure 10:
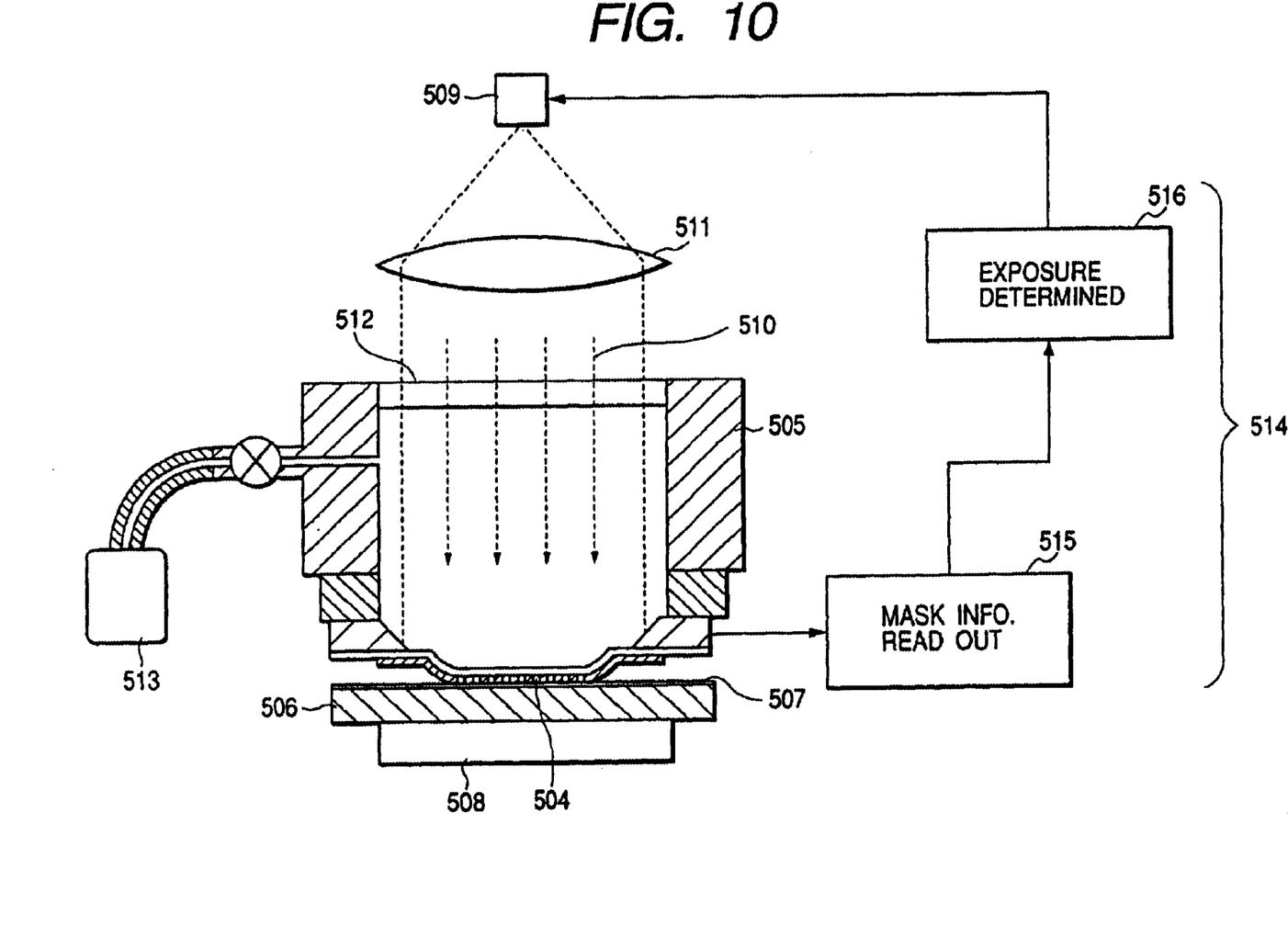
FIG. 10 is a schematic illustration of an exposure system used in Example 1 and comprising another means for regulating the quantity of light.

The quantity of light emitted from the light source 509 may be regulated appropriately by recording information on the aperture density on the mask to be used for exposure in advance so that the exposure apparatus can read out the information necessary for regulating the quantity of light. FIG. 9 shows the process to near-field light when the information on the aperture density of the mask to be used for the operation is recorded on the mask and FIG. 10 shows the configuration of the exposure system. As a mask is placed in position in the exposure apparatus of the present invention, the apparatus reads the information on the aperture density recorded on the mask by reading means 515. The appropriate quantity of light to be used for the exposure is determined by a quantity-of-light-for-exposure determining means 516 on the basis of the read-out information and the quantity of light emitted from the light source for exposure is regulated by changing the voltage applied to the light source if the light source is a semiconductor laser. With this arrangement, the quantity-of-light regulating means 514 is formed by the mask information reading means 515 and the quantity-of-light-for-exposure determining means 516.

When a same quantity of light is irradiated to apertures of a size smaller than the wavelength of light, near-field light comes out more strongly from a mask showing a higher aperture density as shown in FIGS. 3A and 3B than from a mask having a lower aperture density as shown in FIGS. 4A and 4B. Therefore, the quantity of light emitted from the light source needs to be reduced by the quantity-of-light regulating means 514 to avoid over-exposure when using a mask as shown in FIGS. 3A and 3B, whereas the quantity of light emitted from the light source needs to be increased by the quantity-of-light regulating means 514 to avoid under-exposure when using a mask as shown in FIGS. 4A and 4B.

Thus, in the example, an appropriate quantity of light can be obtained by regulating it when one or more than one mask 501 with different aperture densities is/are used.

If a mask showing different aperture densities in itself is used, the mask may be positionally shifted and the object to be processed may be exposed to near-field light twice or more than twice.

EXAMPLE 2

Figure 6A:
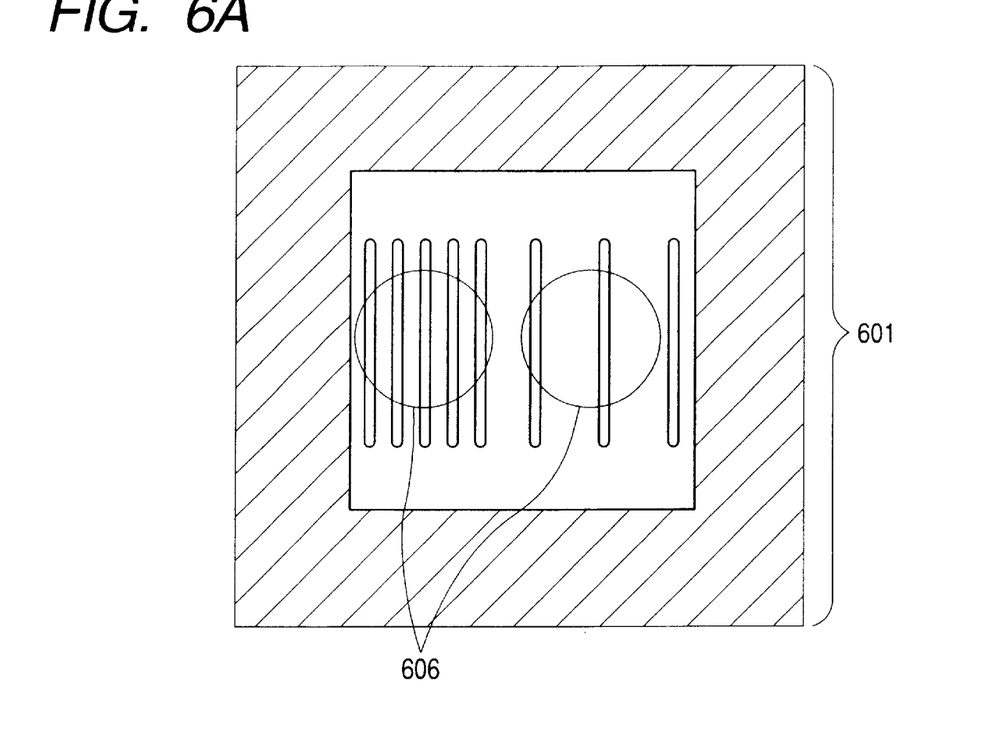
FIG. 6A is a schematic illustration of an exposure mask for near-field light providing a reference for comparison purposes to Example 2 and Example 3.
Figure 6B:
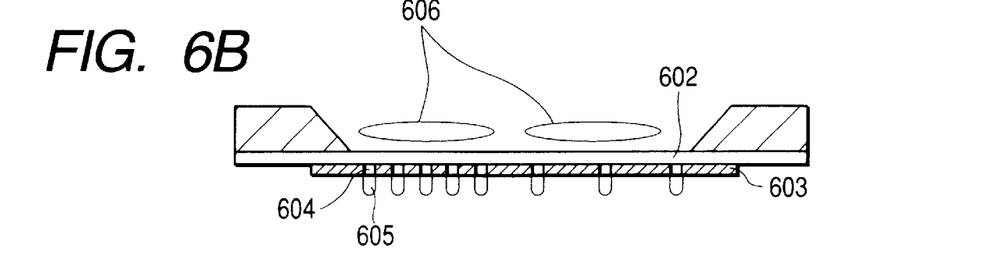
FIG. 6B is a schematic cross-sectional view of the mask.

The configurations of the masks of this example will be described by referring to FIGS. 6A through 6C and 7A through 7C. The masks of this example operate as ordinary masks and also as quantity-of-light regulating means described above by referring to Example 1. FIGS. 6A and 6B show a mask showing different aperture densities in itself and FIGS. 7A and 7B show a mask that operates both as a mask and also as quantity-of-light regulating means.

Referring to FIGS. 6A and 6B, as with the mask 501 of Example 1, the mask 601 comprises a mask matrix 602, a metal thin film 603 and a micro-aperture pattern 604 formed in the metal thin film 603. The mask 601 differs from the mask 501 in that the density of micro-apertures in regions 606 of a size as large as the wavelength of light varies from region to region in the same mask 601. It will be appreciated that the density of micro-apertures of the pattern normally varies in a same mask in photolithography operations.

Figure 6C:
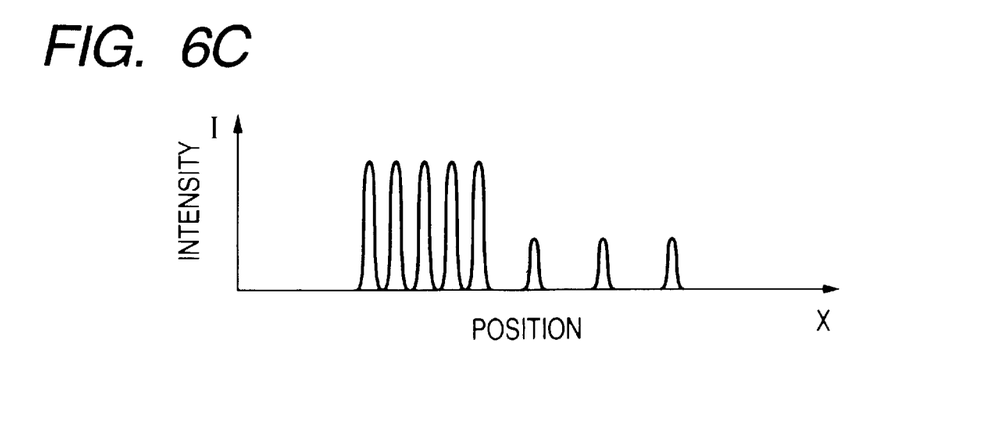
FIG. 6C is a graph showing the intensity of light coming out of the apertures of FIGS. 6A and 6B.
Figure 7A:
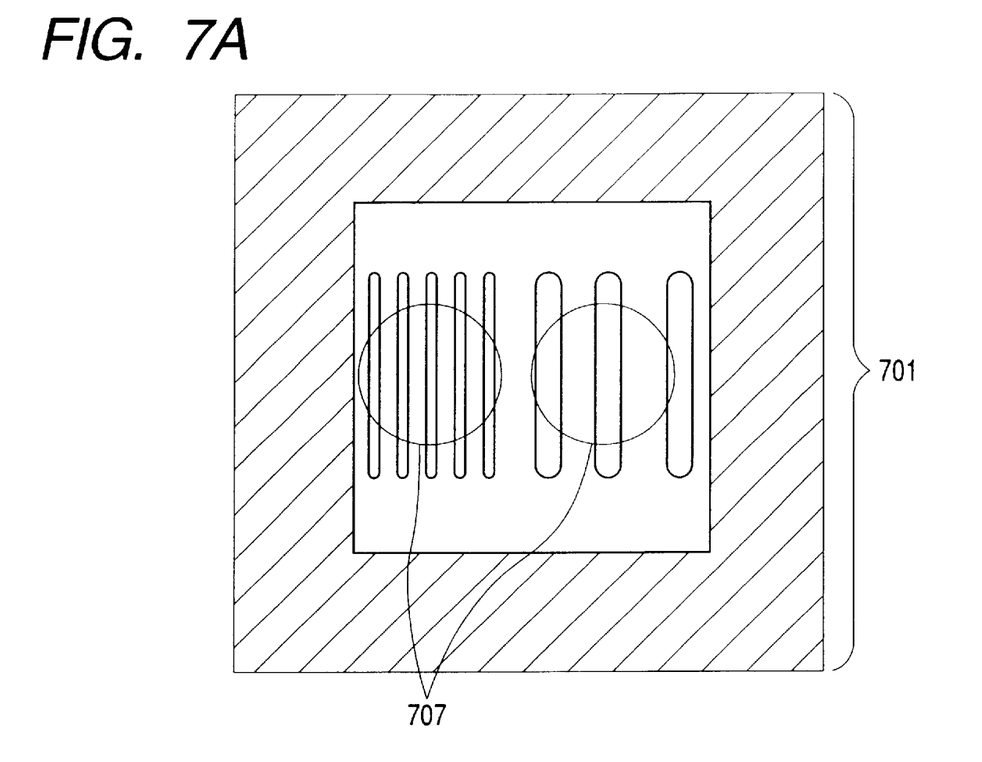
FIG. 7A is a schematic illustration of the exposure mask for near-field light used in Example 2.
Figure 7B:
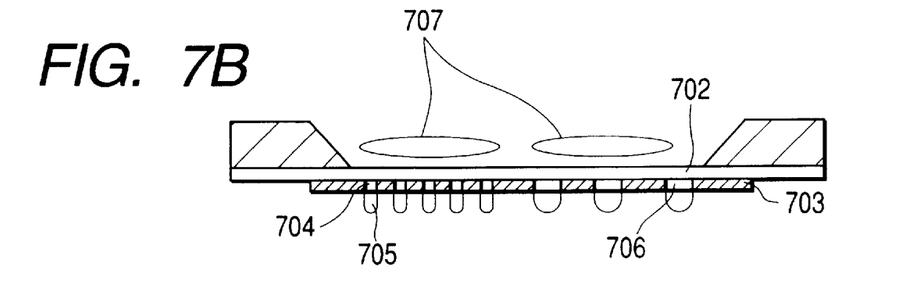
FIG. 7B is a schematic cross-sectional view of the mask of FIG. 7A.
Figure 7C:
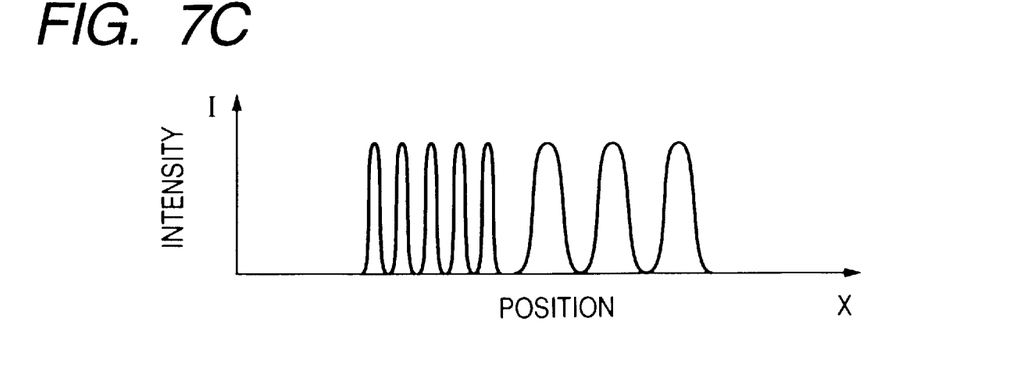
FIG. 7C is a graph showing the intensity of light coming out of the apertures of FIGS. 7A and 7B.

When the mask 601 is used for exposure in the exposure apparatus of Example 1, the intensity of near-field light 605 seeping out of the mask can vary from region to region as long as the aperture density of the mask varies from region to region even if the quantity of light emitted from the light source can be regulated from mask to mask (see FIG. 6C). Therefore, while the quantity-of-light regulating means 514 is controlled appropriately for exposure according to the aperture density of each region in the mask in Example 1, the mask 701 as shown in FIGS. 7A and 7B is used to regulate the quantity of light in this Example. Like the mask 601, the mask 701 comprises a mask matrix 702, a metal thin film 703 and a micro-aperture pattern 704 formed in the metal thin film 703. The aperture density of the micro-aperture pattern 704 of the mask 701 can vary from region to region.

With the mask 701, the aperture width is made to vary as a function of the density of apertures in a specific region to regulate the intensity of generated near-field light 705 and hence the quantity of light to which the object to be processed is exposed.

Since the intensity of generated near-field light is raised as large apertures 706 are used, the intensity of near-field light is raised in a region of the mask 701 showing a low aperture density by broadening the apertures there in order to realize an intensity of near-field light the same as that of the other regions. With this arrangement, a uniform intensity of near-field light can be realized for the apertures of any regions of the mask 701 during the operation of exposing an object to be processed to near-field light so that the object may be uniformly exposed to light. While the intensity of near-field light is raised by broadening the apertures of a region where the aperture density is low in the above-description, it may alternatively and conversely be so arranged that the intensity of near-field light is reduced by narrowing the apertures of a region where the aperture density is high in order to realize a uniform intensity of near-field light. In short, the aperture width and the quantity of light may be regulated to realize a desired aperture width and a desired aperture density for the pattern to be formed on the object.

EXAMPLE 3

Figure 8A:
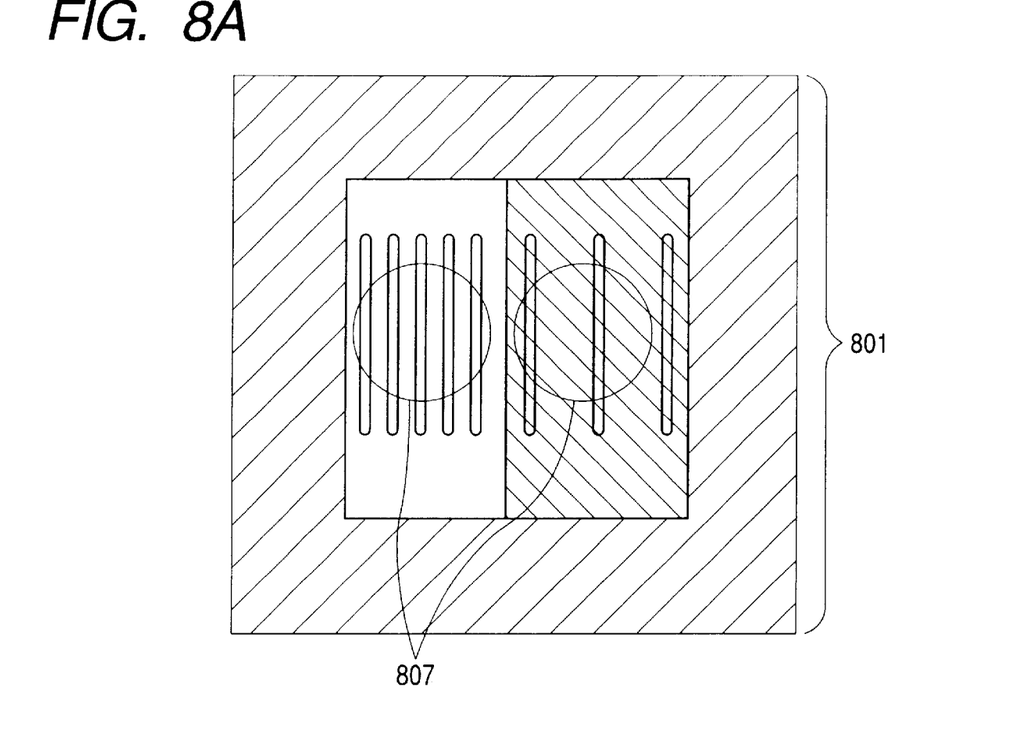
FIG. 8A is a schematic illustration of the exposure mask for near-field light used in Example 3.
Figure 8B:
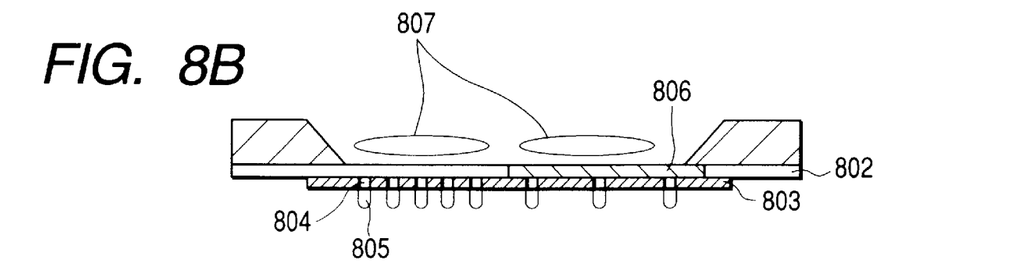
FIG. 8B is a schematic cross-sectional view of the mask of FIG. 8A.

In this example, an exposure mask comprises a mask matrix whose transmissivity can be modified as a function of the aperture desnity of each region of the mask where the aperture density can vary from region to region. FIGS. 8A and 8B schematically illustrate the exposure mask of this example.

As in Example 2, the intensity of near-field light seeping out of the mask can vary from region to region. Therefore, in this example, the intensity of near-field light is controlled by varying the transmissivity light being transmitted through the mask.

Referring to FIGS. 8A and 8B, the mask 801 has regions 807 having a size as large as the wavelength of light where the aperture 804 density can vary from region to region. Therefore, the intensity of near-field light 805 coming out of the mask can vary from region to region. Thus, the quantity of light per unit area irradiated from the light source 509 for exposure and getting to the metal thin film 803 is regulated by modifying the transmissivity of the mask matrix 802 in order to realize a uniform intensity of near-field light.

Figure 8C:
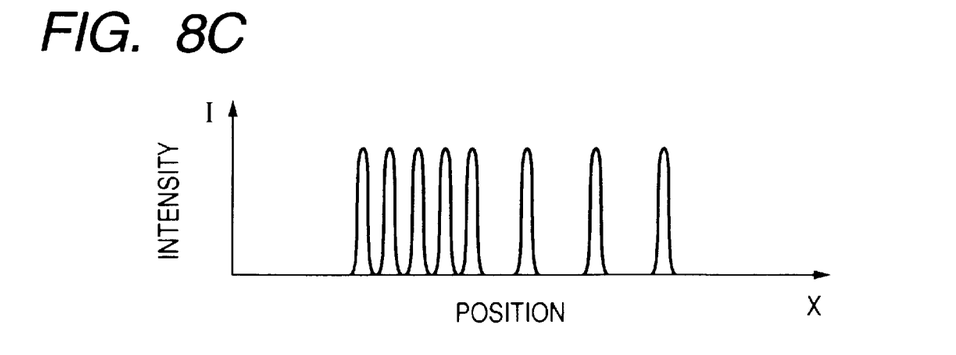
FIG. 8C is a graph showing the intensity of light coming out of the apertures of FIGS. 8A and 8B.

The intensity of near-field light can be raised by reducing the thickness of the mask material or replacing it by a matrix 806 showing a higher transmissivity in a region where the aperture density is low to consequently increase the quantity of light that the region receives. With this arrangement, near-field light coming out of the mask can be made to show a uniform intensity to realize a uniform exposure operation (see FIG. 8C). While the transmissivity of the matrix is changed in the above description, the same effect of uniformly exposing the object to be processed to light can be obtained conversely by depositing a very thin metal film on the matrix in a region showing a high aperture density by evaporation, or the matrix is replaced by a matrix showing a lower transmissivity in the region.

As described above in detail, according to the invention, there are provided an exposure method and an exposure apparatus using near-field light for exposure with which the quantity of light that an object to be micro-processed receives per unit area can be regulated as a function of the aperture density of the mask to be used for the exposure operation. There is also provided an exposure mask particularly adapted to such an exposure method and such an exposure apparatus.

According to the invention, it is now possible to expose an object to be processed to near-field light with a uniform intensity by regulating the intensity of near-field light even when masks whose density of apertures having a size smaller than the wavelength of light in a unit region having a size as large as the wavelength of light can vary from mask to mask, or a mask having regions where the aperture density varies from region to region is used.

What is claimed is:

1. An exposure method using near-field light, said method comprising:
    a step of controlling the position of an exposure mask to control the distance between the exposure mask and an object to be processed so as to make the object to be located in a region where near-field light is present; and
    a step of exposing the object to be processed to light by controlling the intensity of near-field light as a function of the aperture density of the exposure mask.

2. An exposure method according to claim 1, wherein the intensity of near-field light is controlled by reducing the quantity of light coming from a light source as the aperture density of the exposure mask increases and increasing the quantity of light coming from the light source as the aperture density of the exposure mask decreases.

3. An exposure method according to claim 1, wherein the intensity of near-field light is controlled by modifying the aperture width of the exposure mask for regions of the exposure mask showing different aperture densities.

4. An exposure method according to claim 1, wherein the intensity of near-field light is controlled by modifying the transmittivity relative to light for exposure regions of the exposure mask showing different aperture densities.

5. An exposure method according to claim 4, wherein the transmittivity is controlled by using materials showing different transmittivities relative to light for exposure for the mask matrix.

6. An exposure apparatus to be used for performing an exposure method according to any one of claims 1 through 5.

7. An exposure apparatus using near-field light, said apparatus comprising:
    light irradiating means for irradiating light to be used for exposure;
    gap controlling means for controlling the gap between an object to be processed and an exposure mask;
    support means for supporting the exposure mask having at least a pair of apertures of a size smaller than the wavelength of light to be used for exposure arranged in a region of a size as large as the wavelength of light to be used for exposure; and
    control means for controlling the intensity of near-field light as a function of the aperture density of the exposure mask.

8. An exposure apparatus according to claim 7, wherein said control means comprises means for regulating the quantity of light from the light irradiating means as a function of the aperture density of the exposure mask.

9. An exposure apparatus according to claim 7, wherein said control means comprises means for varying the aperture width in regions of the exposure mask showing different aperture densities.

10. An exposure apparatus according to claim 7, wherein said control means comprises means for varying the transmittivity in regions of the exposure mask showing different aperture densities.

11. An exposure apparatus according to claim 10, wherein the transmittivity of the mask matrix varies in regions of the exposure mask showing different aperture densities.

12. An exposure mask comprising:
    at least a pair of apertures having a size smaller than the wavelength of light to be used for exposure arranged in a region having a size as large as the wavelength of light to be used for exposure.

13. An exposure mask according to claim 12, wherein the aperture width varies in regions of the exposure mask showing different aperture densities.

14. An exposure mask according to claim 12, wherein the transmittivity varies in regions of the exposure mask showing different aperture densities.

15. An exposure mask according to claim 14, wherein the transmittivity of the mask matrix relative to light to be used for exposure varies in regions of the exposure mask showing different aperture densities.

16. An exposure method using near-field light, said method comprising:
    a step of adjusting the position of an exposure mask to adjust the distance between the exposure mask and an object to be processed so as to make the object to be located in a region where near-field light is present; and
    at least one step selected from the following steps according to the aperture density of the exposure mask to expose the object to light,
    (a) reducing or increasing the quantity of light to be irradiated from a light source,
    (b) varying the aperture width of the exposure mask showing different aperture densities, and
    (c) varying the transmissivity in regions of the exposure mask showing different aperture densities.

17. An exposure apparatus using near-field light, said apparatus comprising:
    light irradiating means for irradiating light to be used for exposure;
    gap adjusting means for adjusting the gap between an object to be processed and and exposure mask;
    support means for supporting the exposure mask having at least a pair of apertures of a size smaller than the wavelength of light to be used for exposure arranged in a region of a size as large as the wavelength of light to be used for exposure; and at least one controlling means selected from the following groups according to the aperture density of the exposure mask,
   (a) quantity of light regulating means for regulating the quantity of light from the light irradiating means,
   (b) aperture width varying means for varying the aperture width in regions of the exposure mask showing different aperture densities, and
   (c) transmissivity varying means for varying the transmissivity in regions of the exposure mask showing different aperture densities.

* * * * *

UNITED STATES PATENT AND TRADEMARK OFFICE
CERTIFICATE OF CORRECTION

PATENT NO.   : 6,720,115 B2
DATED        : April 13, 2004
INVENTOR(S)  : Yasuhisa Inao et al.

It is certified that error appears in the above-identified patent and that said Letters Patent is hereby corrected as shown below:

Column 1,
Line 37, "SNOM)" should read -- SNOM --.

Column 2,
Line 7, "Gratings"" should read --  Gratings, " --.

Column 5,
Line 18, "shows" should read -- show --.

Column 7,
Line 18, "shows" should read -- show --.

Column 8,
Line 22, "means 513" should read -- means 513, --.
Line 40, "example, an" should read -- example, when an --.

Column 10,
Line 47, "desnity" should read -- density --.

Column 11,
Line 53, "trasnmittivity" should read -- transmissivity -- and "exposure regions" should read -- exposure in regions --.
Line 57, "transmittivity" should read -- transmissivity --.
Line 58, "transmittivities" should read -- transmissivities --.

UNITED STATES PATENT AND TRADEMARK OFFICE
CERTIFICATE OF CORRECTION

PATENT NO.    : 6,720,115 B2
DATED         : April 13, 2004
INVENTOR(S)   : Yasuhisa Inao et al.

It is certified that error appears in the above-identified patent and that said Letters Patent is hereby corrected as shown below:

Column 12,
Lines 22, 25, 37 and 40, "transmittivity" should read -- transmissivity --.
Line 65, the second occurrence of "and" should be deleted.

Signed and Sealed this

Seventeenth Day of August, 2004

JON W. DUDAS
*Acting Director of the United States Patent and Trademark Office*